US012684692B2

(12) United States Patent
Haga et al.

(10) Patent No.: US 12,684,692 B2
(45) Date of Patent: Jul. 14, 2026

(54) PRINTED CIRCUIT BOARD AND DYNAMIC BRAKE CIRCUIT COMPRISING SAME

(71) Applicant: Fanuc Corporation, Yamanashi (JP)

(72) Inventors: Shunta Haga, Yamanashi (JP);
Tsutomu Shikagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 217 days.

(21) Appl. No.: 18/716,243

(22) PCT Filed: Dec. 14, 2021

(86) PCT No.: PCT/JP2021/046113
§ 371 (c)(1),
(2) Date: Jun. 4, 2024

(87) PCT Pub. No.: WO2023/112164
PCT Pub. Date: Jun. 22, 2023

(65) Prior Publication Data
US 2025/0040052 A1 Jan. 30, 2025

(51) Int. Cl.
*H05K 1/18* (2026.01)
*H02P 3/22* (2006.01)
*H05K 1/11* (2006.01)

(52) U.S. Cl.
CPC ................. *H05K 1/18* (2013.01); *H02P 3/22* (2013.01); *H05K 1/115* (2013.01); *H05K 2201/10022* (2013.01); *H05K 2201/10053* (2013.01); *H05K 2201/10522* (2013.01)

(58) Field of Classification Search
CPC ... H05K 1/0296; H05K 1/0287; H05K 1/0286
See application file for complete search history.

(56) References Cited

U.S. PATENT DOCUMENTS

| 2012/0229122 A1 | 9/2012 | Yanagihashi et al. | |
| 2020/0162009 A1* | 5/2020 | Hatakeyama | F25B 31/02 |
| 2026/0019013 A1* | 1/2026 | Nakatsuka | H02P 6/24 |

FOREIGN PATENT DOCUMENTS

| JP | H0991063 A | 4/1997 |
| JP | 2000348588 A | 12/2000 |
| JP | 2001286175 A | 10/2001 |
| JP | 2003079169 A | 3/2003 |

(Continued)

OTHER PUBLICATIONS

International Search Report (PCT/ISA/210) with English translation and Written Opinion (PCT/ISA/237) mailed on Mar. 15, 2022, by the Japanese Patent Office as the International Searching Authority for International Application No. PCT/JP2021/046113.

*Primary Examiner* — Timothy J Thompson
*Assistant Examiner* — Amol H Patel
(74) *Attorney, Agent, or Firm* — BUCHANAN INGERSOLL & ROONEY PC

(57) ABSTRACT

In this printed circuit board, on which two first relays and a single second relay can be selectively mounted, two shared through-holes which are shared by the connection of the terminals of the first relays and the connection of the terminal of the second relay and two first relay-dedicated through-holes which are used only for the connection of the terminals of the first relays are disposed in a line along a prescribed direction.

11 Claims, 7 Drawing Sheets

(56)                           References Cited

FOREIGN PATENT DOCUMENTS

| | | | | |
|----|-------------|---|---|---------|
| JP | 2003272500 | A | | 9/2003 |
| JP | 2011018788 | A | * | 1/2011 |
| TW | 201140981 | A | | 11/2011 |

* cited by examiner

PRINTED CIRCUIT BOARD AND DYNAMIC BRAKE CIRCUIT COMPRISING SAME

CROSS REFERENCE TO RELATED APPLICATIONS

This is the U.S. National Phase application of PCT/JP2021/046113, filed Dec. 14, 2021, the disclosure of this application being incorporated herein by reference in its entirety for all purposes.

FIELD OF THE INVENTION

The present invention relates to a printed board and a dynamic brake circuit including the same.

BACKGROUND OF THE INVENTION

Various components are mounted on a printed board in addition to a wiring pattern. A relay is also one of the components that can be mounted on the printed board, and the printed board is designed and manufactured according to the type, number, and the like of relays to be mounted.

For example, a printed wiring board for digital input/output interfaces that connect between mutually different digital circuits is known, the printed wiring board for digital input/output interfaces including: connection terminals of both main elements for digital input and output that are arranged in such a way that mounting areas thereof partially overlap each other; an input circuit formed together with the mounted main element for input; and an output circuit formed together with the main element for output (For example, see PTL 1.).

For example, a control board for an air conditioner outdoor unit including: a converter circuit that converts single-phase 2-wire alternating current voltage to direct current voltage; a relay circuit that is arranged on an alternating current line to energize and de-energize the converter circuit; an inverter circuit that drives a compressor; an actuator control circuit that controls a fan motor and an expansion valve for controlling a refrigeration cycle; and a control power source circuit that supplies power to a circuit for controlling a microcomputer from the direct current voltage output from the converter circuit is known, wherein the relay circuit is provided with both of a first through-hole group capable of mounting a rectangular relay for AC 15A with contacts located in a widthwise direction of a relay case and a second through-hole group capable of mounting a rectangular relay for AC 20A with contacts located in a lengthwise direction of the relay case, and the contacts of the relay installed on the alternating current line are provided on two lines mutually different between the relay for AC 15A and the relay for AC 20A (For example, see PTL 2.).

PATENT LITERATURE

[PTL 1] JP 1997 (H09)-091063A
[PTL 2] JP 2011-018788A

SUMMARY OF THE INVENTION

In a relay that switches or interrupts a path of electric current in an electric circuit, the type and number of relays are selected according to the magnitude of current flowing through the relay. Thus, it is necessary to fabricate different printed boards for the selected type and number of relays, resulting in problems such as increased cost and cumbersome inventory management due to increased design and manufacturing processes. For example, in a dynamic brake circuit that dynamically brakes a three-phase alternating current motor, a relay is used as a component that causes a short circuit between phases of a power line between a motor and an inverter (amplifier) for driving the motor. According to the magnitude of maximum current flowing through the power line between the motor and the inverter, for example, two 1C contact relays or one 2C contact relay is used. Since the relay is mounted on a printed board and then incorporated into the dynamic brake circuit, a printed board used for mounting two 1C contact relays and a printed board used for mounting one 2C contact relay have to be designed and manufactured separately. Accordingly, it is desired to achieve a single printed board on which different types and numbers of relays can be selectively mounted and a dynamic brake circuit including the same.

According to one aspect of the present disclosure, a printed board on which two first relays and one second relay can be selectively mounted includes two common through-holes shared by connection of a terminal of the first relay and by connection of a terminal of the second relay and two first relay-exclusive through-holes used only for connection of a terminal of the first relay, being arranged in a row along a predetermined direction, wherein the two common through-holes are arranged between the two first relay-exclusive through-holes along the predetermined direction.

According to one aspect of the present disclosure, a printed board on which two first relays and one second relay can be selectively mounted includes: two common through-holes for coil terminals shared by connection of a coil terminal of the first relay and by connection of a coil terminal of the second relay and two first relay-exclusive through-holes for coil terminals used only for connection of a coil terminal of the first relay, being arranged in a row along a predetermined direction; two common through-holes for fixed terminals shared by connection of a fixed terminal of the first relay and by connection of a fixed terminal of the second relay and two first relay-exclusive through-holes for fixed terminals used only for connection of a fixed terminal of the first relay, being arranged in a row along the predetermined direction; and two common through-holes for movable terminals shared by connection of a movable terminal of the first relay and by connection of a movable terminal of the second relay and two first relay-exclusive through-holes for movable terminals used only for connection of a movable terminal of the first relay, being arranged in a row along the predetermined direction.

According to one aspect of the present disclosure, a dynamic brake circuit includes: the above printed board; two first relays or one second relay mounted on the printed board; and three dynamic brake resistors, wherein two of the three dynamic brake resistors have one end connected to each of two phases of three-phase power lines linking between a motor and an inverter and another end connected to each of the two common through-holes for fixed terminals or each of the two first relay-exclusive through-holes for fixed terminals of the printed board, and remaining one of the three dynamic brake resistors has one end connected to remaining one phase of the three-phase power lines and another end connected to the common through-hole for movable terminals or the first relay-exclusive through-hole for movable terminals of the printed board.

According to one aspect of the present disclosure, a printed board and a dynamic brake circuit including the same allow different types and numbers of relays to be mounted on the same printed board. This eliminates the need to fabricate different printed boards for the selected type and number of relays, thereby achieving cost reduction and simplified inventory management.

DETAILED DESCRIPTION OF EMBODIMENTS OF THE INVENTION

Hereinafter, a printed board and a dynamic brake circuit including the same will be described with reference to drawings. A similar member is denoted by a similar reference sign in each of the drawings. Further, for ease of understanding, these drawings are scaled as appropriate. The illustrated embodiments are one example for implementation and are not limited to these embodiments.

Figure 1:
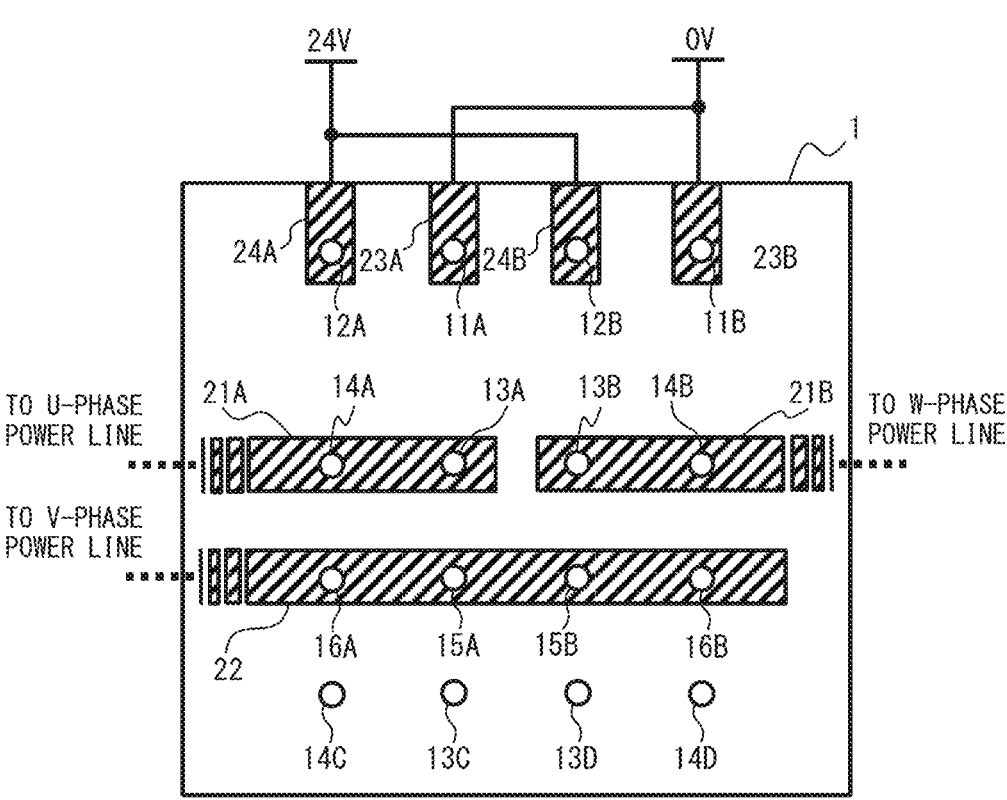
FIG. 1 is a top view illustrating a printed board according to one embodiment of the present disclosure.

FIG. 1 is a top view illustrating a printed board according to one embodiment of the present disclosure.

In a printed board 1 according to one embodiment of the present disclosure, two common through-holes shared by connection of a terminal of a first relay and by connection of a terminal of a second relay and two first relay-exclusive through-holes used only for connection of a terminal of the first relay are arranged in a row along a predetermined direction, and the two common through-holes are arranged between the two first relay-exclusive through-holes along the predetermined direction. The "predetermined direction" is a juxtaposition direction of two first relays mounted on the printed board 1, which will be described later in detail. The first relay is, for example, a 1C contact relay, and the second relay is, for example, a 2C contact relay. Note that, both the first relay and the second relay may be 2C contact relays.

The printed board 1 includes, as through-holes, common through-holes 11A and 12B for coil terminals, first relay-exclusive through-holes 11B and 12A for coil terminals, common through-holes 13A, 13B, 13C, and 13D for fixed terminals, first relay-exclusive through-holes 14A, 14B, 14C, and 14D for fixed terminals, common through-holes 15A and 15B for movable terminals, and first relay-exclusive through-holes 16A and 16B for movable terminals. Each through-hole is a hole that goes all the way through the printed board 1, and each terminal of the first relay or the second relay is inserted into each through-hole and soldered, thereby mounting the first relay or the second relay on the printed board 1. Further, the printed board 1 includes, as conductive printed wiring patterns, a first printed wiring pattern 21A for fixed terminals, a second printed wiring pattern 21B for fixed terminals, a printed wiring pattern 22 for movable terminals, and printed wiring patterns 23A, 23B, 24A, and 24B for coil terminals. Note that, the illustrated width of each printed wiring pattern is one example, and any width can be set.

Each of the two common through-holes 11A and 12B for coil terminals is a through-hole shared by connection of a coil terminal of the first relay and by connection of a coil terminal of the second relay. Each of the two first relay-exclusive through-holes 12A and 11B for coil terminals is a through-hole used only for connection of a coil terminal of the first relay. The common through-hole 11A for coil terminals is arranged adjacent to the first relay-exclusive through-hole 12A for coil terminals. The common through-hole 12B for coil terminals is arranged adjacent to the common through-hole 11A for coil terminals. The first relay-exclusive through-hole 11B for coil terminals is arranged adjacent to the common through-hole 12B for coil terminals. The first relay-exclusive through-hole 12A for coil terminals, the common through-hole 11A for coil terminals, the common through-hole 12B for coil terminals, and the first relay-exclusive through-hole 11B for coil terminals are arranged in a row along a predetermined direction on the printed board 1. The "predetermined direction" is a juxtaposition direction of two first relays mounted on the printed board 1. The two common through-holes 11A and 12B for coil terminals are arranged between the two first relay-exclusive through-holes 12A and 11B for coil terminals along the above predetermined direction.

Further, the first relay-exclusive through-hole 12A for coil terminals, the common through-hole 11A for coil terminals, the common through-hole 12B for coil terminals, and the first relay-exclusive through-hole 11B for coil terminals are arranged in such a way that an interval between the common through-hole 11A for coil terminals and the first relay-exclusive through-hole 12A for coil terminals adjacent to the common through-hole 11A for coil terminals and an interval between the common through-hole 12B for coil terminals and the first relay-exclusive through-hole 11B for coil terminals adjacent to the common through-hole 12B for coil terminals are both equal to an interval between two coil terminals of the first relay. Further, the two common through-holes 11A and 12B for coil terminals are arranged in such a way that an interval therebetween is equal to an interval between two coil terminals of the second relay. For example, when an interval between two coil terminals of the first relay is equal to an interval between two coil terminals of the second relay, the first relay-exclusive through-hole 12A for coil terminals, the common through-hole 11A for coil terminals, the common through-hole 12B for coil terminals, and the first relay-exclusive through-hole 11B for coil terminals are arranged in a row at equal intervals in the above predetermined direction.

A b-contact (break contact, normally closed contact) of a fixed terminal of the 1C contact relay (first relay) and the 2C contact relay (second relay) is electrically connected to any of the common through-holes 13A and 13B for fixed terminals and the first relay-exclusive through-holes 14A and 14B for fixed terminals. An a-contact (make contact, normally-on contact) of a fixed terminal of the 1C contact relay (first relay) and the 2C contact relay (second relay) is electrically connected to any of the common through-holes 13C and 13D for fixed terminals and the first relay-exclusive through-holes 14C and 14D for fixed terminals. Note that, the 1C contact relay includes two fixed terminals having the b-contact, these two fixed terminals being electrically continuous, and similarly includes two fixed terminals having the a-contact, these two fixed terminals being electrically continuous.

The through-holes for fixed terminals are arranged as follows.

Each of the two common through-holes 13A and 13B for fixed terminals is a through-hole shared by connection of a fixed terminal having the b-contact of the first relay and by connection of a fixed terminal having the b-contact of the second relay. Each of the two first relay-exclusive through-holes 14A and 14B for fixed terminals is a through-hole used only for connection of a fixed terminal having the b-contact of the first relay. The common through-hole 13A for fixed terminals is arranged adjacent to the first relay-exclusive through-hole 14A for fixed terminals. The common through-hole 13B for fixed terminals is arranged adjacent to the common through-hole 13A for fixed terminals. The first relay-exclusive through-hole 14B for fixed terminals is arranged adjacent to the common through-hole 13B for fixed terminals. The first relay-exclusive through-hole 14A for fixed terminals, the common through-hole 13A for fixed terminals, the common through-hole 13B for fixed terminals, and the first relay-exclusive through-hole 14B for fixed terminals are arranged in a row along the above predetermined direction. The two common through-holes 13A and 13B for fixed terminals are arranged between the two first relay-exclusive through-holes 14A and 14B for fixed terminals along the above predetermined direction.

Further, the first relay-exclusive through-hole 14A for fixed terminals, the common through-hole 13A for fixed terminals, the common through-hole 13B for fixed terminals, and the first relay-exclusive through-hole 14B for fixed terminals are arranged in such a way that an interval between the common through-hole 13A for fixed terminals and the first relay-exclusive through-hole 14A for fixed terminals adjacent to the common through-hole 13A for fixed terminals and an interval between the common through-hole 13B for fixed terminals and the first relay-exclusive through-hole 14B for fixed terminals adjacent to the common through-hole 13B for fixed terminals are both equal to an interval between two fixed terminals of the first relay. Further, the two common through-holes 13A and 13B for fixed terminals are arranged in such a way that an interval therebetween is equal to an interval between two fixed terminals of the second relay. For example, when an interval between two fixed terminals of the first relay is equal to an interval between two fixed terminals of the second relay, the first relay-exclusive through-hole 14A for fixed terminals, the common through-hole 13A for fixed terminals, the common through-hole 13B for fixed terminals, and the first relay-exclusive through-hole 14B for fixed terminals are arranged in a row at equal intervals in the above predetermined direction.

Similarly, each of the two common through-holes 13C and 13D for fixed terminals is a through-hole shared by connection of a fixed terminal having the a-contact of the first relay and by connection of a fixed terminal having the a-contact of the second relay. Each of the two first relay-exclusive through-holes 14C and 14D for fixed terminals is a through-hole used only for connection of a fixed terminal having the a-contact of the first relay. The common through-hole 13C for fixed terminals is arranged adjacent to the first relay-exclusive through-hole 14C for fixed terminals. The common through-hole 13D for fixed terminals is arranged adjacent to the common through-hole 13C for fixed terminals. The first relay-exclusive through-hole 14D for fixed terminals is arranged adjacent to the common through-hole 13D for fixed terminals. The first relay-exclusive through-hole 14C for fixed terminals, the common through-hole 13C for fixed terminals, the common through-hole 13D for fixed terminals, and the first relay-exclusive through-hole 14D for fixed terminals are arranged in a row along the above predetermined direction. The two common through-holes 13C and 13D for fixed terminals are arranged between the two first relay-exclusive through-holes 14C and 14D for fixed terminals along the above predetermined direction.

Further, the first relay-exclusive through-hole 14C for fixed terminals, the common through-hole 13C for fixed terminals, the common through-hole 13D for fixed terminals, and the first relay-exclusive through-hole 14D for fixed terminals are arranged in such a way that an interval between the common through-hole 13C for fixed terminals and the first relay-exclusive through-hole 14D for fixed terminals adjacent to the common through-hole 13C for fixed terminals and an interval between the common through-hole 13D for fixed terminals and the first relay-exclusive through-hole 14D for fixed terminals adjacent to the common through-hole 13D for fixed terminals are both equal to an interval between two fixed terminals of the first relay. Further, the two common through-holes 13C and 13D for fixed terminals are arranged in such a way that an interval therebetween is equal to an interval between two fixed terminals of the second relay. For example, when an interval between two fixed terminals of the first relay is equal to an interval between two fixed terminals of the second relay, the first relay-exclusive through-hole 14C for fixed terminals, the common through-hole 13C for fixed terminals, the common through-hole 13D for fixed terminals, and the first relay-exclusive through-hole 14D for fixed terminals are arranged in a row at equal intervals in the above predetermined direction.

Each of the two common through-holes 15A and 15B for movable terminals is a through-hole shared by connection of a movable terminal of the first relay and by connection of a movable terminal of the second relay. Each of the two first relay-exclusive through-holes 16A and 16B for movable terminals is a through-hole used only for connection of a movable terminal of the first relay. Each of the common through-holes 15A and 15B for movable terminals is a through-hole shared by connection of a movable terminal of the first relay and by connection of a movable terminal of the second relay. The common through-hole 15A for movable terminals is arranged adjacent to the first relay-exclusive through-hole 16A for movable terminals. The common through-hole 15B for movable terminals is arranged adjacent to the common through-hole 15A for movable terminals. The first relay-exclusive through-hole 16B for movable terminals is arranged adjacent to the common through-hole 15B for movable terminals. The first relay-exclusive through-hole 16A for movable terminals, the common through-hole 15A for movable terminals, the common through-hole 15B for movable terminals, and the first relay-exclusive through-hole 16B for movable terminals are arranged in a row along the above predetermined direction. The two common through-holes 15A and 15B for movable terminals are arranged between the two first relay-exclusive through-holes 16A and 16B for movable terminals along the above predetermined direction.

Further, the first relay-exclusive through-hole 16A for movable terminals, the common through-hole 15A for movable terminals, the common through-hole 15B for movable terminals, and the first relay-exclusive through-hole 16B for movable terminals are arranged in such a way that an interval between the common through-hole 15A for movable terminals and the first relay-exclusive through-hole 16A for movable terminals adjacent to the common through-hole 15A for movable terminals and an interval between the common through-hole 15B for movable terminals and the first relay-exclusive through-hole 16B for movable terminals adjacent to the common through-hole 15B for movable terminals are both equal to an interval between two movable terminals of the first relay. Further, the two common through-holes 15A and 15B for movable terminals are arranged in such a way that an interval therebetween is equal to an interval between two movable terminals of the second relay. For example, when an interval between two movable terminals of the first relay is equal to an interval between two movable terminals of the second relay, the first relay-exclusive through-hole 16A for movable terminals, the common through-hole 15A for movable terminals, the common through-hole 15B for movable terminals, and the first relay-exclusive through-hole 16B for movable terminals are arranged in a row at equal intervals in the above predetermined direction.

Each through-hole provided on the printed board 1 as described above is provided with a printed wiring pattern as appropriate according to a relationship between wiring of a three-phase alternating current circuit in which the printed board 1 is installed and arrangement of each terminal of a relay to be mounted on the printed board 1. As one example, a case in which the printed board 1 is applied to a dynamic brake circuit provided in a motor drive device will be described.

Figure 2:
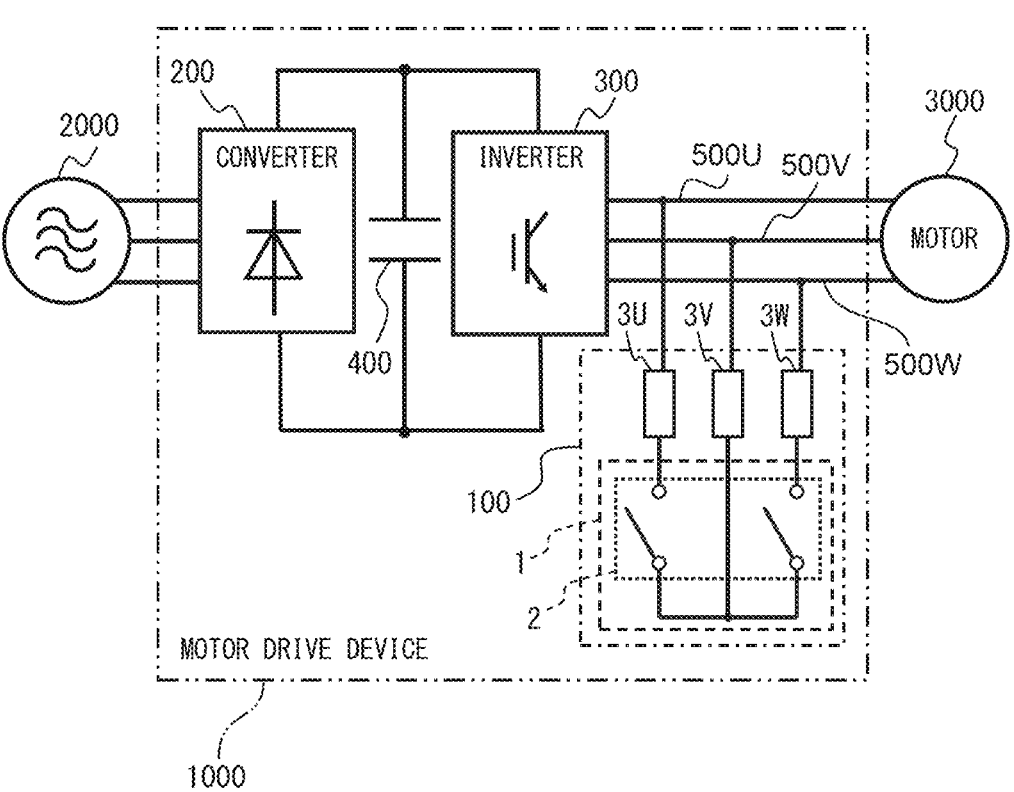
FIG. 2 is a circuit diagram illustrating a motor drive device including a dynamic brake circuit according to one embodiment of the present disclosure.

FIG. 2 is a circuit diagram illustrating a motor drive device including a dynamic brake circuit according to one embodiment of the present disclosure.

As one example, a case of controlling a three-phase alternating current motor 3000 by a motor drive device 1000 connected to a three-phase alternating current power source 2000 will be illustrated.

The motor drive device 1000 includes a dynamic brake circuit 100, a converter 200, an inverter 300, and a capacitor 400.

The converter 200 converts alternating current power supplied from the three-phase alternating current power source 2000 to direct current power, and outputs the direct current power to a DC link. Examples of the converter 200 include a diode rectifier circuit, a 120-degree energized rectifier circuit, and a rectifier circuit with a PWM switching control system.

The DC link that is a circuit portion electrically connecting between a direct current output side of the converter 200 and a direct current input side of the inverter 300 is provided with the capacitor 400. The DC link may be referred to as a "DC link unit", a "direct current link", a "direct current link unit", a "direct current busbar", a "direct current intermediate circuit", or the like. The capacitor 400 may be referred to as a "DC link capacitor", a "smoothing capacitor", or the like. The capacitor 400 includes a function of accumulating energy (direct current power) in the DC link and a function of suppressing pulsation of direct current-side output of the converter 200. Electric charge on the capacitor 400 results in accumulation of direct current power in the DC link.

The inverter 300 converts direct current power in the DC link to alternating current power, and outputs the alternating current power to the motor 3000 side. Examples of the inverter 300 include a PWM inverter internally including a semiconductor switching element. While the semiconductor switching element is constituted by, for example, a unipolar transistor such as an FET, a bipolar transistor, an IGBT, a thyristor, a GTO, or the like, the type per se of the semiconductor switching element does not limit the present embodiment, and other semiconductor switching elements may be used.

The inverter 300 and the motor 3000 are linked by a U-phase power line 500U, a V-phase power line 500V, and a W-phase power line 500W. Three-phase alternating current power output from the inverter 300 is supplied to the motor 3000 via the power lines 500U, 500V, and 500W.

The dynamic brake circuit 100 is connected to the power lines 500U, 500V, and 500W linking between the inverter 300 and the motor 3000. The dynamic brake circuit 100 includes a relay 2 mounted on the printed board 1 and dynamic brake resistors 3U, 3V, and 3W. The relay 2 is composed of two 1C contact relays or one 2C contact relay. Further, the relay 2 is, for example, a normally closed contact relay (i.e., a normally-on switch).

In order to simplify description of an operation of the dynamic brake circuit 100, a pair of movable and fixed contacts of the relay 2 is simply referred to as a "switch", a state in which the movable and fixed contacts are closed is referred to as "switch-on", and a state in which the movable and fixed contacts are open is referred to as "switch-off".

In an example illustrated in FIG. 2, as one example, a switch (i.e., a pair of movable and fixed contacts) of the relay 2 is connected in series to each of the dynamic brake resistors 3U and 3W. A series circuit consisting of the dynamic brake resistors 3U, 3V, and 3W and the switch of the relay 2 is provided between input terminals of the motor 3000 (between phases of winding of the motor 3000). The switch-on and off of the relay 2 is controlled by a brake control power source (not illustrated) according to voltage applied (for example, 24 [V] or 0 [V] applied) between coil terminals of the relay 2. The switch is turned off by applying voltage (for example, 24 [V]) between coil terminals of the relay 2 while the motor 3000 is rotationally driven by the motor drive device 1000, and the switch is turned on by applying no voltage between coil terminals of the relay 2 upon braking the motor 3000 by the dynamic brake circuit 100.

Upon braking the motor 3000 by the dynamic brake circuit 100, supply of drive power to the motor 3000 by the inverter 300 is blocked, and then the switch is turned on in the dynamic brake circuit 100 to cause a short circuit between input terminals of the motor 3000 via the dynamic brake resistors 3U, 3V, and 3W. At the time, even though the motor 3000 is electrically disconnected from the power source, a field flux still exists and the motor 3000 rotating by inertia acts as a generator, and thus dynamic brake current generated by this flows into the dynamic brake resistors 3U, 3V, and 3W via the turned-on switch and is converted to Joule heat and consumed by the dynamic brake resistors 3U, 3V, and 3W, resulting in a deceleration torque in the motor 3000. This deceleration torque brakes the motor 3000, and the motor 3000 stops finally.

In order to achieve wiring in the dynamic brake circuit 100 described with reference to FIG. 2 by using the relay 2 composed of two 1C contact relays or one 2C contact relay, the printed board 1 on which two 1C contact relays (first relays) and one 2C contact relay (second relay) can be selectively mounted is provided with printed wiring patterns as illustrated in FIG. 1.

As illustrated in FIG. 1, the printed board 1 is provided with: the first printed wiring pattern 21A for fixed terminals that electrically connects between the common through-hole 13A for fixed terminals and the first relay-exclusive through-hole 14A for fixed terminals adjacent to the common through-hole 13A for fixed terminals; the second printed wiring pattern 21B for fixed terminals that electrically connects between the common through-hole 13B for fixed terminals and the first relay-exclusive through-hole 14B for fixed terminals adjacent to the common through-hole 13B for fixed terminals; and the printed wiring pattern 22 for movable terminals that electrically connects all of the two common through-holes 15A and 15B for movable terminals and the two first relay-exclusive through-holes 16A and 16B for movable terminals. The first printed wiring pattern 21A for fixed terminals is electrically connected to the U-phase power line 500U. The second printed wiring pattern 21B for fixed terminals is electrically connected to the W-phase power line 500W. The printed wiring pattern 22 for movable terminals is electrically connected to the V-phase power line 500V. Meanwhile, no printed wiring pattern connected to the common through-holes 13C and 13D for fixed terminals and the first relay-exclusive through-holes 14C and 14D for fixed terminals is provided. Therefore, each of the common through-holes 13C and 13D for fixed terminals and the first relay-exclusive through-holes 14C and 14D for fixed terminals is insulated against another through-hole, another printed wiring pattern, and another electronic component.

Furthermore, the printed board 1 is provided with: the printed wiring pattern 23A for coil terminals for electrically connecting the common through-hole 11A for coil terminals to 0 [V] of the brake control power source; the printed wiring pattern 24B for coil terminals for electrically connecting the common through-hole 12B for coil terminals to a terminal capable of outputting 24 [V] of the brake control power source; the printed wiring pattern 24A for coil terminals for electrically connecting the first relay-exclusive through-hole 12A for coil terminals to a terminal capable of outputting 24 [V] of the brake control power source; and the printed wiring pattern 23B for coil terminals for electrically connecting the first relay-exclusive through-hole 11B for coil terminals to 0 [V] of the brake control power source.

The through-holes and the printed wiring patterns as illustrated in FIG. 1 are provided in the printed board 1, and thereby the dynamic brake resistors 3U and 3W have one end thereof electrically connected to each of the U-phase power line 500U and the W-phase power line 500V, and have another end thereof electrically connected to each of the two common through-holes 13A and 13B for fixed terminals or each of the two first relay-exclusive through-holes 14A and 14B for fixed terminals of the printed board 1. Further, the dynamic brake resistor 3V has one end thereof electrically connected to the V-phase power line 500V and another end thereof electrically connected to the common through-hole 15A (or 15B) for movable terminals or the first relay-exclusive through-hole 16A (or 16B) for movable terminals of the printed board 1.

As described above, the through-holes and the printed wiring patterns as illustrated in FIG. 1 are provided in the printed board 1, and thereby two 1C contact relays (first relays) and one 2C contact relay (second relay) can be selectively mounted as the relay 2 of the dynamic brake circuit 100 described with reference to FIG. 2.

Figures 3A, 3B:
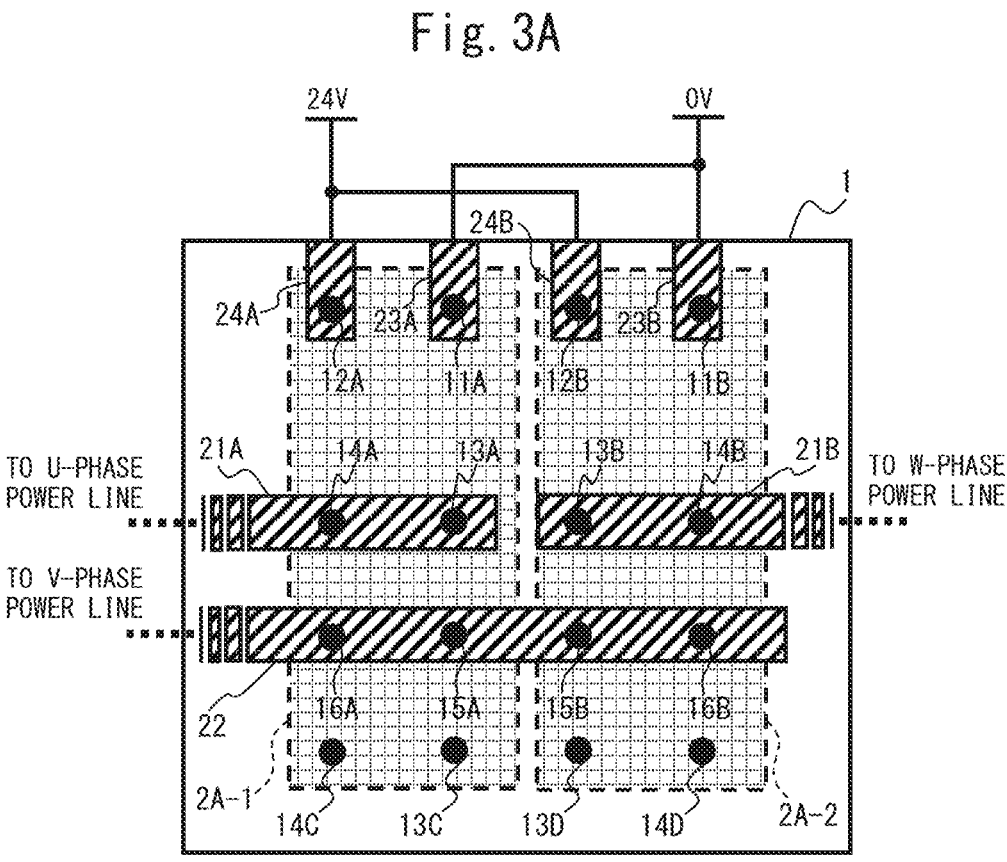
FIG. 3A is a top view when two 1C contact relays are mounted on the printed board according to one embodiment of the present disclosure.
FIG. 3B is a circuit diagram schematically illustrating the 1C contact relay.

FIG. 3A is a top view when two 1C contact relays are mounted on the printed board according to one embodiment of the present disclosure. In FIG. 3A, a through-hole used for mounting is indicated by a black circle "●". FIG. 3B is a circuit diagram schematically illustrating the 1C contact relay.

As illustrated in FIG. 3B, each of 1C contact relays 2A-1 and 2A-2 includes an a-contact 31*a* and a b-contact 31*b* as fixed contacts coupled to a fixed terminal and a movable piece 32 coupled to a movable terminal and having a movable contact at a tip. When the 1C contact relays 2A-1 and 2A-2 are normally closed contact relays, the movable piece 32 makes contact with the a-contact 31*a* as voltage (for example, 24 [V]) is applied between coil terminals of the 1C contact relays 2A-1 and 2A-2, and the movable piece 32 makes contact with the b-contact 31*b* as no voltage is applied between coil terminals of the 1C contact relays 2A-1 and 2A-2.

As illustrated in FIG. 3A, the two 1C contact relays 2A-1 and 2A-2 are mounted side by side (i.e., juxtaposed) along the above predetermined direction via the common through-holes and the first relay-exclusive through-holes on the printed board 1. In other words, a juxtaposition direction of the two 1C contact relays 2A-1 and 2A-2 matches a direction along which two common through-holes shared by connection of a terminal of the 1C contact relay and by connection of a terminal of the 2C contact relay and two first relay-exclusive through-holes used only for connection of the 1C contact relay are arranged in a row. More specifically, two coil terminals of the 1C contact relay 2A-1 are electrically connected to the first relay-exclusive through-hole 12A for coil terminals and the common through-hole 11A for coil terminals. A fixed terminal having the b-contact of the 1C contact relay 2A-1 is electrically connected to the first relay-exclusive through-hole 14C for fixed terminals and the common through-hole 13C for fixed terminals. A fixed terminal having the a-contact of the 1C contact relay 2A-1 is electrically connected to the first relay-exclusive through-hole 14A for fixed terminals and the common through-hole 13A for fixed terminals. Two movable terminals of the 1C contact relay 2A-1 are electrically connected to the first relay-exclusive through-hole 16A for movable terminals and the common through-hole 15A for movable terminals. Further, two coil terminals of the 1C contact relay 2A-2 are electrically connected to the common through-hole 12B for coil terminals and the first relay-exclusive through-hole 11B for coil terminals. A fixed terminal having the b-contact of the 1C contact relay 2A-2 is electrically connected to the common through-hole 13B for fixed terminals and the first relay-exclusive through-hole 14B for fixed terminals. A fixed terminal having the a-contact of the 1C contact relay 2A-2 is electrically connected to the first relay-exclusive through-hole 14D for fixed terminals and the common through-hole 13D for fixed terminals. Two movable terminals of the 1C contact relay 2A-2 are electrically connected to the common through-hole 15B for movable terminals and the first relay-exclusive through-hole 16B for movable terminals. In this way, when the two 1C contact relays 2A-1 and 2A-2 are mounted on the printed board 1, the 1C contact relays 2A-1 and 2A-2 are mounted side by side in the above predetermined direction.

Figures 4A, 4B:
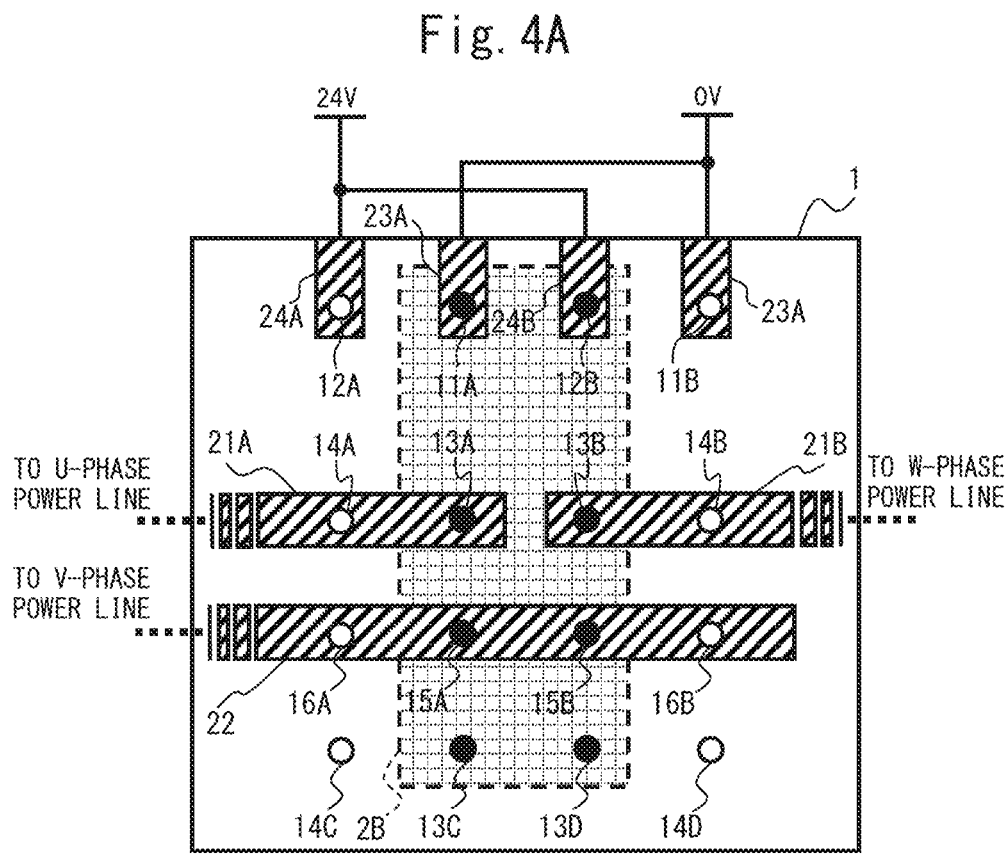
FIG. 4A is a top view when one 2C contact relay is mounted on the printed board according to one embodiment of the present disclosure.
FIG. 4B is a circuit diagram schematically illustrating the 2C contact relay.

FIG. 4A is a top view when one 2C contact relay is mounted on the printed board according to one embodiment of the present disclosure. In FIG. 4A, a through-hole used for mounting is indicated by a black circle "●", and a through-hole not used for mounting is indicated by a white circle "○". FIG. 4B is a circuit diagram schematically illustrating the 2C contact relay.

As illustrated in FIG. 4B, a 2C contact relay 2B includes a-contacts 33a-1 and 33a-2 and b-contacts 33b-1 and 33b-2 as fixed contacts coupled to a fixed terminal and movable pieces 34-1 and 34-2 coupled to a movable terminal and having a movable contact at a tip. The movable piece 34-1 and the movable piece 34-2 operate in conjunction with each other. When the 2C contact relay 2B is a normally closed contact relay, the movable piece 34-1 makes contact with the a-contact 33a-1 and the movable piece 34-2 makes contact with the a-contact 33a-2 as voltage (for example, 24 [V]) is applied between coil terminals of the 2C contact relay 2B, and the movable piece 34-1 makes contact with the b-contact 33b-1 and the movable piece 34-2 makes contact with the b-contact 33b-2 as no voltage is applied between coil terminals of the 2C contact relay 2B.

As illustrated in FIG. 4A, the one 2C contact relay 2B is mounted only via the common through-holes on the printed board 1. More specifically, two coil terminals of the 2C contact relay 2B are electrically connected to the common through-holes 11A and 12B for coil terminals. A fixed terminal having the a-contact of the 2C contact relay 2B is electrically connected to the common through-holes 13C and 13D for fixed terminals. A fixed terminal having the b-contact of the 2C contact relay 2B is electrically connected to the common through-holes 13A and 13B for fixed terminals. A movable terminal of the 2C contact relay 2B is electrically connected to the common through-holes 15A and 15B for movable terminals. In this way, when the one 2C contact relay is mounted on the printed board 1, the one 2C contact relay is mounted in a vicinity of center, unlike when the two 1C contact relays 2A-1 and 2A-2 are mounted on the printed board 1.

Figure 5A:
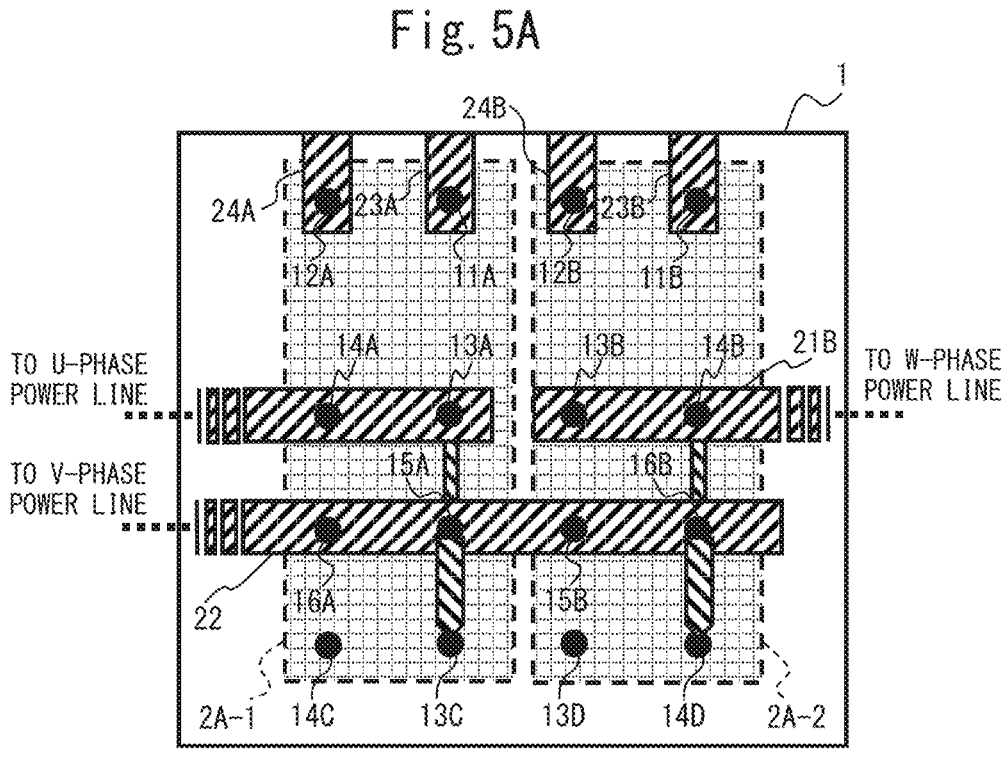
FIG. 5A is a top view describing an operation of the 1C contact relay mounted on the printed board incorporated into the dynamic brake circuit according to one embodiment of the present disclosure, and schematically illustrates an operation of the 1C contact relay when voltage is applied between coil terminals.
Figure 5B:
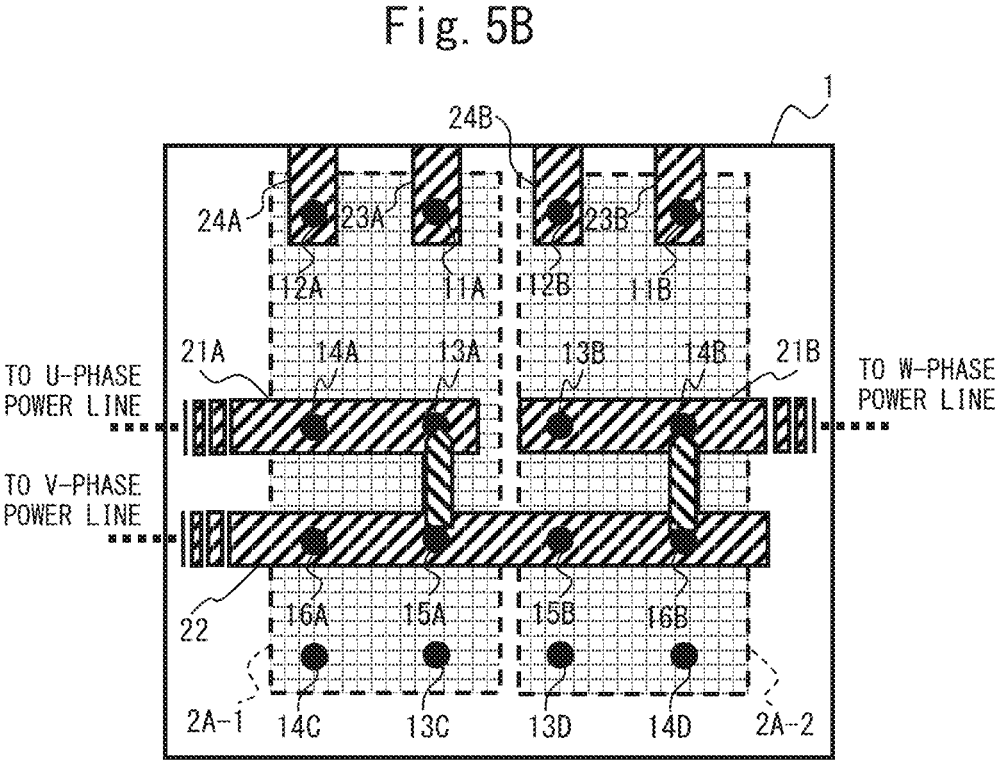
FIG. 5B is a top view describing an operation of the 1C contact relay mounted on the printed board incorporated into the dynamic brake circuit according to one embodiment of the present disclosure, and schematically illustrates an operation of the 1C contact relay when no voltage is applied between coil terminals.

FIGS. 5A and 5B are top views describing an operation of the 1C contact relay mounted on the printed board incorporated into the dynamic brake circuit according to one embodiment of the present disclosure. FIG. 5A schematically illustrates an operation of the 1C contact relay when voltage is applied between coil terminals, and FIG. 5B schematically illustrates an operation of the 1C contact relay when no voltage is applied between coil terminals. For ease of understanding, a movable piece of the 1C contact relay is schematically illustrated with a shaded thick arrow.

While the motor 3000 is rotationally driven by the motor drive device 1000, voltage (for example, 24 [V]) is applied between the first relay-exclusive through-hole 12A for coil terminals and the common through-hole 11A for coil terminals connected to a coil terminal of the 1C contact relay 2A-1, and thereby a movable contact connected to the common through-hole 15A for movable terminals is brought into contact with an a-terminal of a fixed contact connected to the common through-hole 13C for fixed terminals so as not to cause a short circuit between the U-phase power line

500U and the V-phase power line 500V, as illustrated in FIG. 5A. Similarly, voltage (for example, 24 [V]) is applied between the common through-hole 12B for coil terminals and the first relay-exclusive through-hole 11B for coil terminals connected to a coil terminal of the 1C contact relay 2A-2, and thereby a movable contact connected to the first relay-exclusive through-hole 16B for movable terminals is brought into contact with an a-terminal of a fixed contact connected to the first relay-exclusive through-hole 14D for fixed terminals so as not to cause a short circuit between the W-phase power line 500W and the V-phase power line 500V.

Upon braking the motor 3000 by the dynamic brake circuit 100, no voltage is applied (i.e., a voltage of 0 [V] is applied) between the first relay-exclusive through-hole 12A for coil terminals and the common through-hole 11A for coil terminals connected to a coil terminal of the 1C contact relay 2A-1, and thereby a movable contact connected to the common through-hole 15A for movable terminals is brought into contact with a b-terminal of a fixed contact connected to the common through-hole 13A for fixed terminals to cause a short circuit between the U-phase power line 500U and the V-phase power line 500V via the dynamic brake resistors 3U and 3V, as illustrated in FIG. 5B. Similarly, no voltage is applied (i.e., a voltage of 0 [V] is applied) between the common through-hole 12B for coil terminals and the first relay-exclusive through-hole 11B for coil terminals connected to a coil terminal of the 1C contact relay 2A-2, and thereby a movable contact connected to the first relay-exclusive through-hole 16B for movable terminals is brought into contact with a b-terminal of a fixed contact connected to the first relay-exclusive through-hole 14B for fixed terminals to cause a short circuit between the W-phase power line 500W and the V-phase power line 500V via the dynamic brake resistors 3V and 3W.

Figure 6A:
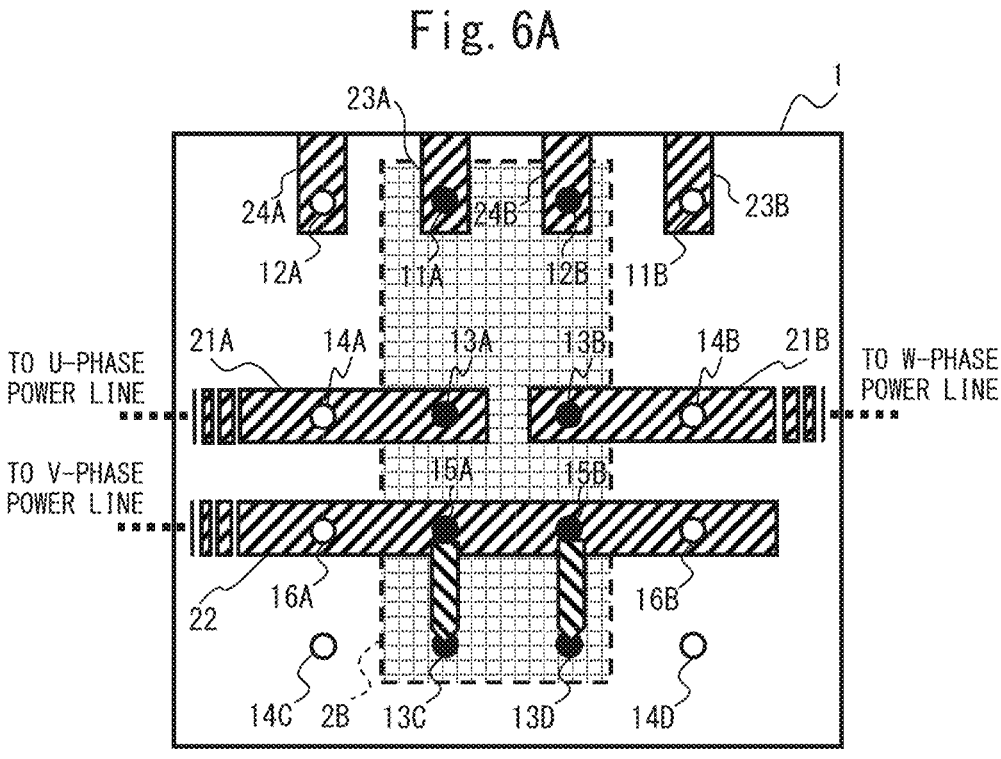
FIG. 6A is a top view describing an operation of the 2C contact relay mounted on the printed board incorporated into the dynamic brake circuit according to one embodiment of the present disclosure, and schematically illustrates an operation of the 2C contact relay when voltage is applied between coil terminals.
Figure 6B:
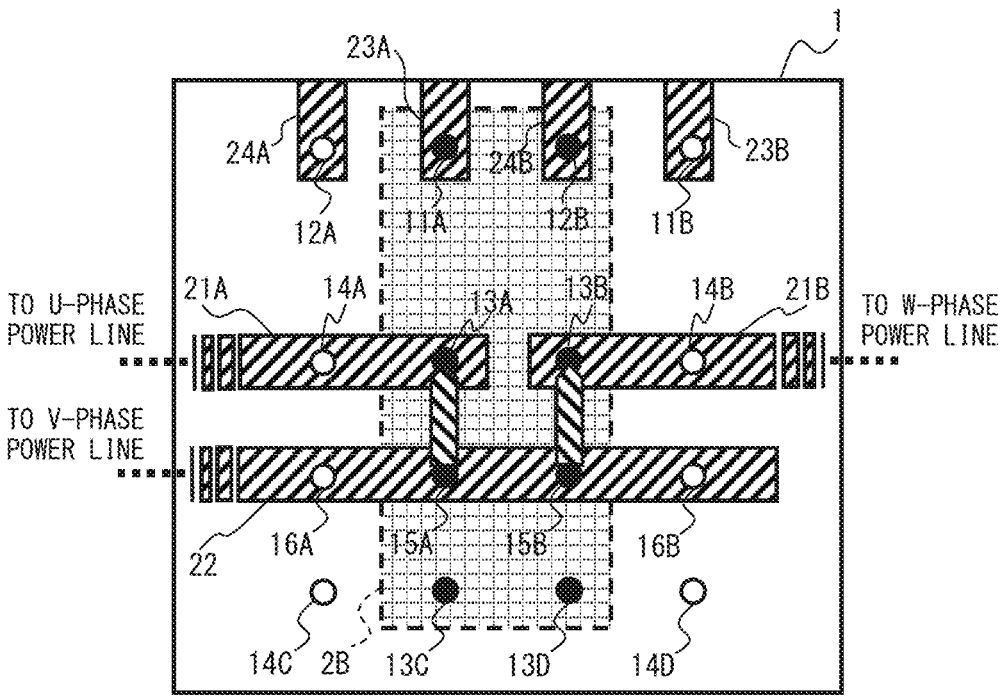
FIG. 6B is a top view describing an operation of the 2C contact relay mounted on the printed board incorporated into the dynamic brake circuit according to one embodiment of the present disclosure, and schematically illustrates an operation of the 2C contact relay when no voltage is applied between coil terminals.

FIGS. 6A and 6B are top views describing an operation of the 2C contact relay mounted on the printed board incorporated into the dynamic brake circuit according to one embodiment of the present disclosure, FIG. 6A schematically illustrates an operation of the 2C contact relay when voltage is applied between coil terminals, and FIG. 6B schematically illustrates an operation of the 2C contact relay when no voltage is applied between coil terminals. For ease of understanding, a movable piece of the 2C contact relay is schematically illustrated with a shaded thick arrow.

While the motor 3000 is rotationally driven by the motor drive device 1000, voltage (for example, 24 [V]) is applied between the common through-hole 12B for coil terminals and the common through-hole 11A for coil terminals connected to a coil terminal of the 2C contact relay 2B, and thereby a movable contact connected to the common through-hole 15A for movable terminals is brought into contact with an a-terminal of a fixed contact connected to the common through-hole 13C for fixed terminals so as not to cause a short circuit between the U-phase power line 500U and the V-phase power line 500V, and a movable contact connected to the common through-hole 15B for movable terminals is brought into contact with an a-terminal of a fixed contact connected to the common through-hole 13D for fixed terminals so as not to cause a short circuit between the W-phase power line 500W and the V-phase power line 500V, as illustrated in FIG. 6A.

Upon braking the motor 3000 by the dynamic brake circuit 100, no voltage is applied (i.e., a voltage of 0 [V] is applied) between the common through-hole 12B for coil terminals and the common through-hole 11A for coil terminals connected to a coil terminal of the 2C contact relay 2B, and thereby a movable contact connected to the common through-hole 15A for movable terminals is brought into contact with a b-terminal of a fixed contact connected to the common through-hole 13A for fixed terminals to cause a short circuit between the U-phase power line 500U and the V-phase power line 500V via the dynamic brake resistors 3U and 3V, and a movable contact connected to the common through-hole 15B for movable terminals is brought into contact with a b-terminal of a fixed contact connected to the common through-hole 13B for fixed terminals to cause a short circuit between the W-phase power line 500W and the V-phase power line 500V via the dynamic brake resistors 3V and 3W, as illustrated in FIG. 6B.

Next, the printed board according to one embodiment of the present disclosure is compared with a conventional printed board.

Figure 7:
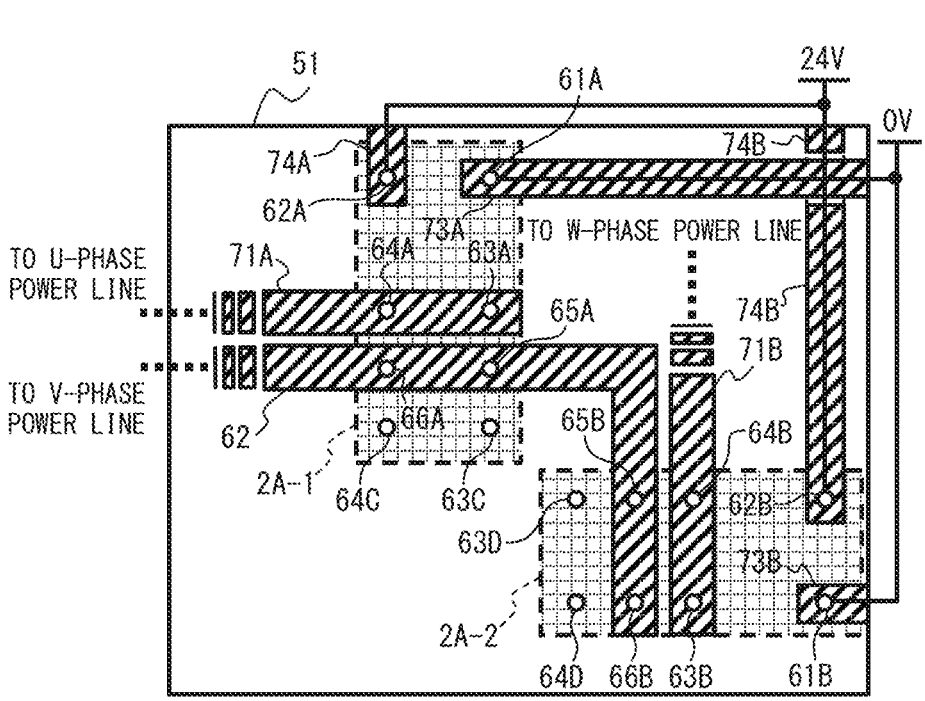
FIG. 7 is a top view illustrating a conventional printed board applied to a dynamic brake circuit when two 1C contact relays are mounted.

FIG. 7 is a top view illustrating a conventional printed board applied to a dynamic brake circuit when two 1C contact relays are mounted. Further, FIG. 8 is a top view illustrating a conventional printed board applied to a dynamic brake circuit when one 2C contact relay is mounted.

As illustrated in FIG. 7, a printed board 51 on which two 1C contact relays 2A-1 and 2A-2 are mounted is provided with: through-holes 61A and 62A for coils, through-holes 63A, 64A, 63C, and 64C for fixed terminals, and through-holes 65A and 66A for movable contacts for electrically connecting terminals of the 1C contact relay 2A-1; and through-holes 61B and 62B for coils, through-holes 63B, 64B, 63D, and 64D for fixed terminals, and through-holes 65B and 66B for movable contacts for electrically connecting terminals of the 1C contact relay 2A-2. Further, printed wiring patterns 62, 71A, 71B, 73A, 73B, 74A, and 74B are provided in order to apply the printed board 51 to a dynamic brake circuit.

Figure 8:
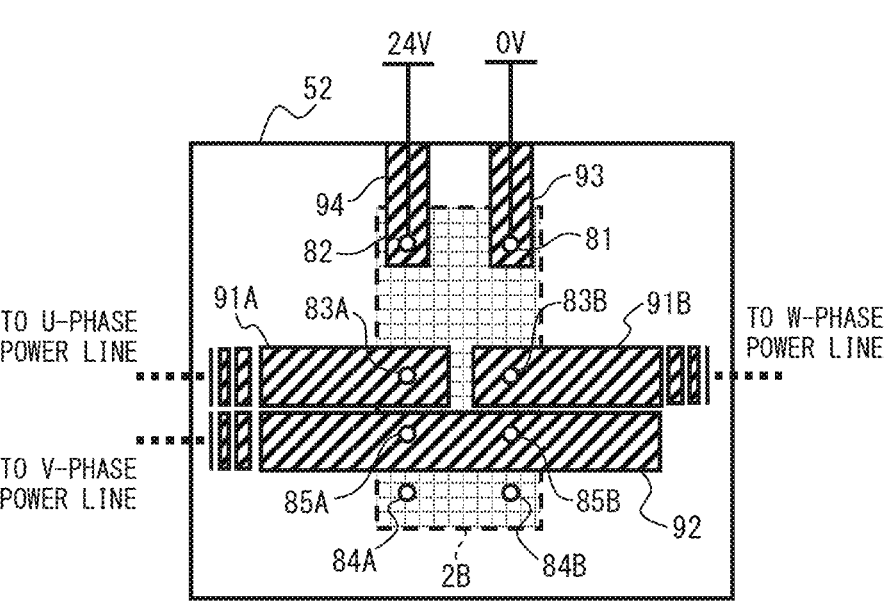
FIG. 8 is a top view illustrating a conventional printed board applied to a dynamic brake circuit when one 2C contact relay is mounted.

As illustrated in FIG. 8, a printed board 52 on which one 2C contact relay 2B is mounted is provided with through-holes 81 and 82 for coils, through-holes 83A, 83B, 84A, and 84B for fixed terminals, and through-holes 85A and 85B for movable contacts for electrically connecting terminals of the 2C contact relay 2B. Further, printed wiring patterns 91A, 91B, 92, 93, and 94 are provided in order to apply the printed board 52 to a dynamic brake circuit.

As described above, conventionally, the printed board 51 on which two 1C contact relays are mounted and the printed board 52 on which one 2C contact relay is mounted had to be provided separately.

In contrast, according to one embodiment of the present disclosure, the two 1C contact relays 2A-1 and 2A-2 (first relays) and the one 2C contact relay 2B (second relay) can be selectively mounted on the one printed board 1. According to one embodiment of the present disclosure, a printed board and a dynamic brake circuit including the same allow different types and numbers of relays to be mounted on the same printed board. This eliminates the need to fabricate different printed boards for the selected type and number of relays, thereby achieving cost reduction and simplified inventory management.

REFERENCE SIGNS LIST

1 Printed board
2 Relay
2A-1, 2A-2 1C contact relay
3U, 3V, 3W Dynamic brake resistor
11A, 12B Common through-hole for coil terminals
11B, 12A First relay-exclusive through-hole for coil terminals

13A, 13B, 13C, 13D Common through-hole for fixed terminals
14A, 14B, 14C, 14D First relay-exclusive through-hole for fixed terminals
15A, 15B Common through-hole for movable terminals
16A, 16B First relay-exclusive through-hole for movable terminals
21A First printed wiring pattern for fixed terminals
21B Second printed wiring pattern for fixed terminals
22 Printed wiring pattern 22 for movable terminals
23A, 23B, 24A, 24B Printed wiring pattern for coil terminals
31*a*, 33*a*-1, 33*a*-2 a-contact
31*b*, 33*b*-1, 33*b*-2 b-contact
32, 34-1, 34-2 Movable piece
100 Dynamic brake circuit
200 Converter
300 Inverter
400 Capacitor
500U U-phase power line
500V V-phase power line
500W W-phase power line
1000 Motor drive device
2000 Three-phase alternating current power source
3000 Motor

The invention claimed is:

1. A printed board on which two first relays and one second relay can be selectively mounted, comprising
   two common through-holes shared by connection of a terminal of the first relay and by connection of a terminal of the second relay and two first relay-exclusive through-holes used only for connection of a terminal of the first relay, being arranged in a row along a predetermined direction,
   wherein the two common through-holes are arranged between the two first relay-exclusive through-holes along the predetermined direction.

2. The printed board according to claim 1, wherein the first relay is a 1C contact relay, and the second relay is a 2C contact relay.

3. A printed board on which two first relays and one second relay can be selectively mounted, comprising:
   two common through-holes for coil terminals shared by connection of a coil terminal of the first relay and by connection of a coil terminal of the second relay and two first relay-exclusive through-holes for coil terminals used only for connection of a coil terminal of the first relay, being arranged in a row along a predetermined direction;
   two common through-holes for fixed terminals shared by connection of a fixed terminal of the first relay and by connection of a fixed terminal of the second relay and two first relay-exclusive through-holes for fixed terminals used only for connection of a fixed terminal of the first relay, being arranged in a row along the predetermined direction; and
   two common through-holes for movable terminals shared by connection of a movable terminal of the first relay and by connection of a movable terminal of the second relay and two first relay-exclusive through-holes for movable terminals used only for connection of a movable terminal of the first relay, being arranged in a row along the predetermined direction.

4. The printed board according to claim 3, wherein the two common through-holes for coil terminals are arranged between the two first relay-exclusive through-holes for coil terminals along the predetermined direction, the two common through-holes for fixed terminals are arranged between the two first relay-exclusive through-holes for fixed terminals along the predetermined direction, and the two common through-holes for movable terminals are arranged between the two first relay-exclusive through-holes for movable terminals along the predetermined direction.

5. The printed board according to claim 3, wherein the two first relays are mounted side by side along the predetermined direction via the two common through-holes for coil terminals, the two first relay-exclusive through-holes for coil terminals, the four common through-holes for fixed terminals, the four first relay-exclusive through-holes for fixed terminals, the two common through-holes for movable terminals, and the two first relay-exclusive through-holes for movable terminals.

6. The printed board according to claim 3, wherein the one second relay is mounted via the two common through-holes for coil terminals, the four common through-holes for fixed terminals, and the two common through-holes for movable terminals.

7. The printed board according to claim 3, wherein an interval between the common through-hole for coil terminals and the first relay-exclusive through-hole for coil terminals adjacent to the common through-hole for coil terminals is equal to an interval between the two coil terminals of the first relay, an interval between the common through-hole for fixed terminals and the first relay-exclusive through-hole for fixed terminals adjacent to the common through-hole for fixed terminals is equal to an interval between the two fixed terminals of the first relay, an interval between the common through-hole for movable terminals and the first relay-exclusive through-hole for movable terminals adjacent to the common through-hole for movable terminals is equal to an interval between the two movable terminals of the first relay, an interval between the two common through-holes for coil terminals is equal to an interval between the two coil terminals of the second relay, an interval between the two common through-holes for fixed terminals is equal to an interval between the two fixed terminals of the second relay, and an interval between the two common through-holes for movable terminals is equal to an interval between the two movable terminals of the second relay.

8. The printed board according to claim 3, wherein a printed wiring pattern for fixed terminals that electrically connects between the common through-hole for fixed terminals and the first relay-exclusive through-hole for fixed terminals adjacent to the common through-hole for fixed terminals and a printed wiring pattern for movable terminals that electrically connects all of the two common through-holes for movable terminals and the two first relay-exclusive through-holes for movable terminals are provided according to wiring of a three-phase alternating current circuit in which the printed board is installed.

9. The printed board according to claim 3, wherein the first relay is a 1C contact relay, and the second relay is a 2C contact relay.

10. A dynamic brake circuit comprising:

the printed board according to claim 3;

the two first relays or the one second relay mounted on the printed board; and three dynamic brake resistors, wherein two of the three dynamic brake resistors have one end connected to each of two phases of three-phase power lines linking between a motor and an inverter and another end connected to each of the two common through-holes for fixed terminals or each of the two first relay-exclusive through-holes for fixed terminals of the printed board, and remaining one of the three dynamic brake resistors has one end connected to remaining one phase of the three-phase power lines and another end connected to the common through-hole for movable terminals or the first relay-exclusive through-hole for movable terminals of the printed board.

11. The dynamic brake circuit according to claim 10, wherein the first relay and the second relay are normally closed contact relays.

* * * * *